United States Patent [19]

Gajda

[11] 4,230,523
[45] Oct. 28, 1980

[54] ETCHANT FOR SILICON DIOXIDE FILMS DISPOSED ATOP SILICON OR METALLIC SILICIDES

[75] Inventor: Joseph J. Gajda, Wappingers Falls, N.Y.

[73] Assignee: International Business Machines Corporation, Armonk, N.Y.

[21] Appl. No.: 974,573

[22] Filed: Dec. 29, 1978

[51] Int. Cl.² .......................................... H01L 21/306
[52] U.S. Cl. .................................... 156/657; 156/662; 252/79.1
[58] Field of Search ............... 156/653, 656, 657, 662, 156/667; 252/79.1, 79.3, 79.4, 143; 134/3

[56] References Cited

U.S. PATENT DOCUMENTS

| 2,399,134 | 4/1946 | Miller et al. | 252/143 |
| 3,448,055 | 6/1969 | Mickelson et al. | 134/3 |
| 3,642,549 | 2/1972 | Couture et al. | 252/79.3 |
| 3,650,969 | 3/1972 | Baltakmens et al. | 252/143 |
| 3,979,241 | 9/1976 | Maeda et al. | 252/79.4 |
| 4,040,897 | 8/1977 | Blish et al. | 156/656 |
| 4,087,367 | 5/1978 | Rioult et al. | 252/79.1 |

FOREIGN PATENT DOCUMENTS 47-14822  5/1972  Japan .................................... 252/79.3

OTHER PUBLICATIONS

Gajda, "Selective . . . Glass", IBM Technical Disclosure Bulletin, vol. 9, No. 11 (4/67), p. 1476.

Primary Examiner—Jerome W. Massie
Attorney, Agent, or Firm—Thomas F. Galvin; James R. McBride

[57] ABSTRACT

An etchant comprising a solution of hydrogen fluoride dissolved in an organic solvent such as glycerine. The solution is substantially free of unbound water and ammonium fluoride. The etchant is particularly suitable for removing silicon dioxide disposed atop a metallic silicide formed in a silicon semiconductor where the silicon may be exposed.

7 Claims, 4 Drawing Figures

ETCHANT FOR SILICON DIOXIDE FILMS DISPOSED ATOP SILICON OR METALLIC SILICIDES

BACKGROUND OF THE INVENTION

1. Field of the Invention

This invention relates to an etchant for etching silicon dioxide while not attacking silicon. In particular, the etchant etches the silicon dioxide while not substantially attacking N type, exposed silicon underlying the oxide and a metallic silicide.

2. Description of the Prior Art

In fabricating semiconductor devices it is the practice to passivate and protect the surface of a body of silicon material with a layer or superimposed layers of inorganic insulating materials, such as silicon dioxide, silicon nitride, etc.

Openings are made through these protective layers to the silicon body both to provide impurity regions within the body as well as to allow conductive layers on top of the body to make contact to the impurity regions. In most instances it is important that the etchant be selective, i.e., it exhibits the property of attacking one of the protective layers without substantially attacking the silicon or the other protective layer. For example, dilute hydrofluoric acid buffered with ammonium fluoride has been used to etch silicon dioxide because it does not substantially attack silicon nitride or silicon. Similarly, hot phosphoric acid will attack silicon nitride while not attacking silicon dioxide, silicon or common photoresist layers.

I have found, however, that the standard buffered HF solution will attack N+ or N−type silicon during semiconductor processing. This is particularly true when the etching solution is in contact simultaneously with exposed highly doped silicon and platinum silicide. The cause is apparently an electrochemical reaction between the silicon and the platinum silicide, with the reaction connection being completed when the semiconductor is dipped into the standard buffered HF solution. This tends to dissolve the silicon, especially N+ silicon.

As an example, consider the fabrication of integrated TTL circuit chips in which PtSi is used both for the ohmic contacts, as well as high-barrier height Schottky barrier diode (SBD) contacts. This is one of the most common integrated circuit structures in the industry, and the fabrication process is well known. After the PtSi is formed in the contact regions, the excess Pt is removed by aqua regia etchant. The only protection for the PtSi is a thin and porous layer, around 30 Å, of $SiO_2$. Because the $SiO_2$ is thin and porous, the aqua regia also may attack localized regions of the PtSi, thereby exposing the N+ or N type silicon in contact regions exposed beneath the PtSi. This, in itself, is not a major problem. However, the next step of standard fabrication process is the removal of the thin $SiO_2$ layer from atop the PtSi using standard buffered HF solution. I have found that the buffered HF attacks the exposed N+ or N type silicon, most likely due to the aforesaid electrochemical reaction between the silicon and the PtSi. This expands the extent and depth of the silicon removal.

The next step in the TTL process is the deposition of a barrier metal such as Cr, Mo, Ti, W or alloys thereof which act as a barrier between the aluminum to be deposited as the interconnection metallurgy and the underlying PtSi and silicon. All of these barrier metals have a significantly lower forward voltage characteristic (Schottky barrier height) than PtSi, and any direct contact between the barrier metal and the N type silicon causes the voltage characteristic to shift, thereby rendering the circuit inoperative.

With regard to the N+ silicon contact regions, the extent of electrochemical dissolution is even worse than it is for N-silicon. The dissolution has caused deep alloying spikes which extend completely through the contact regions during subsequent high temperature processing.

SUMMARY OF THE INVENTION

It is therefore an object of my invention to provide an improved etchant for a silicon dioxide film during semiconductor processing.

It is another object of my invention to provide a method of etching a silicon dioxide film without eroding silicon semiconductor material which may also be exposed to the etchant.

It is a more particular object of my invention to etch said silicon dioxide film wherein said silicon is of the N or N+ conductivity type.

It is yet another object of my invention to prevent the degradation of the characteristics of Schottky barrier diodes which occurs during the semiconductor processing discussed above.

It is yet another object of my invention to prevent junction shorts caused by the reaction of Al and Si during the semiconductor processing discussed above.

These and other objects of my invention are achieved with an etchant which comprises a mixture of hydrofluoric acid and glycerine or other polyhydric alcohol, the solution being substantially free of unbound water. In particular, solutions of 1-4 percent HF in glycerine or other polyhydric alcohol are suitable. A particular embodiment consists of 2 percent HF containing 52 percent water by weight, with the remainder being glycerine plus a small amount, 0-5 percent, of versene or other wetting agent.

DESCRIPTION OF THE PREFERRED EMBODIMENT

Although my invention will be described in terms as a particular, preferred embodiment, it will be understood by those skilled in the art that my invention is in no way limited thereto.

Figure 1:
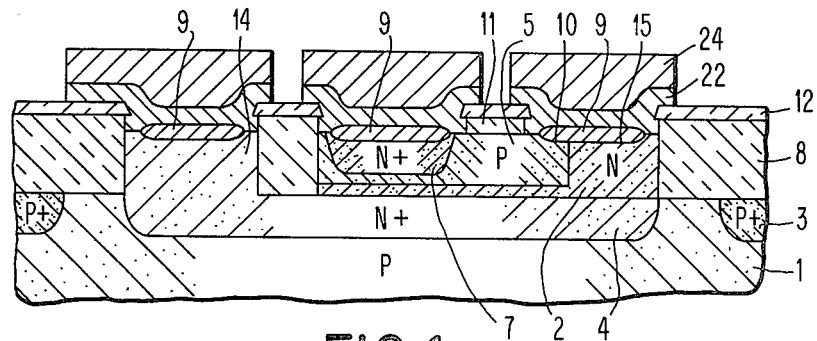
FIG. 1 is a cross-sectional view of a silicon semiconductor substrate having impurity regions formed therein and metallization layers disposed atop the silicon substrate to form a transistor.

FIG. 1 illustrates a typical NPN transistor to which my improved process is directed. The transistor is made in standard fashion with the exception of my improved etchant. A discussion of its fabrication is important to a thorough understanding of my invention. The transistor comprises a P-type substrate 1 and an N-type epitaxial layer 2. Subcollector region 4 has outdiffused into epitaxial layer 2. P-type region 3 and dielectric isolation regions 8 function as isolation regions. Preferably, layer 2 has a thickness of around 2 microns of less and a concentration of from 2.1 to $2.3 \times 10^{16}/cm^3$. The transistor also includes a P-type base region 5 in which is formed an N-type emitter region 7.

A subcollector reachthrough region 14 has been formed which interconnects subcollector region 4 with surface contacts.

The contacts to the impurity regions within the semiconductor preferably comprise platinum silicide 9, chrome barrier layer 22 and aluminum-copper layer 24. Besides making ohmic contact to the base, emitter and collector regions, the metallization also includes a Schottky barrier diode contact to layer 2 at region 15. Thus, a metal-semiconductor (Schottky) diode is provided at the surface of the semiconductor by the metallization which engages regions 10 and 15.

In the fabrication of the contacts, platinum layer 9 is first deposited in blanket fashion atop the substrate and within the exposed impurity regions, the unexposed regions being protected in standard fashion by silicon dioxide layer 11 and silicon nitride layer 12.

The platinum is typically deposited to a thickness of around 400 Å by evaporation or sputtering. The semiconductor wafer is then sintered at around 550° C. for 20 minutes in a nitrogen ambient to cause the platinum to react with the silicon to form platinum silicide 9. The unreacted platinum is then removed by etching in aqua regia. The platinum silicide is protected by a very thin layer which includes silicon dioxide during the process. This layer will be discussed in more detail in succeeding sections of this specification.

As is well known, other metals such as palladium, nickel or hafnium are substitutes for platinum in forming a metallic silicide layer.

In the next step of the process, layers 22 of chrome and layer 24 of aluminum or copper-doped aluminum or copper-doped aluminum-silicon are next deposited, preferably within the same evaporation chamber.

The chrome is deposited to a preferred thickness of between 600 Å and 1,000 Å. Water vapor is bled into the chamber during the evaporation so that a mixture of Cr and $Cr_2O_3$ is formed, rather than pure chromium. The aluminum, which is meant to include copper-doped aluminum, as well as copper-doped aluminum-silicon, is advantageously deposited to a thickness of 8,500 to 10,000 Å. The resultant intermediate structure thereby achieved is illustrated in FIG. 1. In the typical integrated circuit chip process, at least one other level of metallization, and possibly two, are formed to interconnect the many hundreds of circuits formed on the same semiconductor chip.

The deposition of the metallurgy system comprising chrome 22 and aluminum 24 is most advantageously done using the process described in U.S. Pat. No. 4,004,044, which issued in the names of Franco et al and which is assigned to the same assignee as the present application. Alternate techniques for forming the metallurgy are standard wet or reactive ion (plasma) subtractive etching processes which are well known to those of skill in the art. However, the lift-off technique is capable of providing superior definition of metallurgy, thereby minimizing the area required for wiring. In any event, these processes for forming the metallization comprise no part of my invention. In fact, my invention is in no way dependent on the composition of metal layers 22 and 24. Other acceptable metallurgical systems known to those skilled in the semiconductor art could also be used.

Figure 2A:
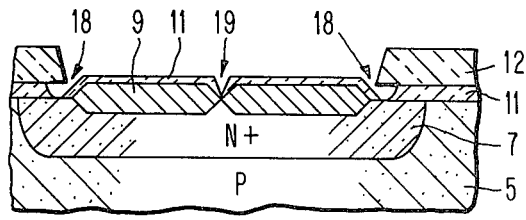
FIGS. 2A-2C are cross-sectional drawings of said transistor showing portions of the transistor in which a failure mechanism takes place which is eliminated by my novel etching mixture.
Figure 2B:
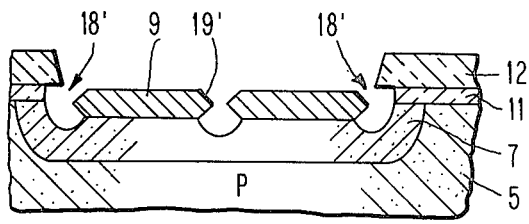
Figure 2C:
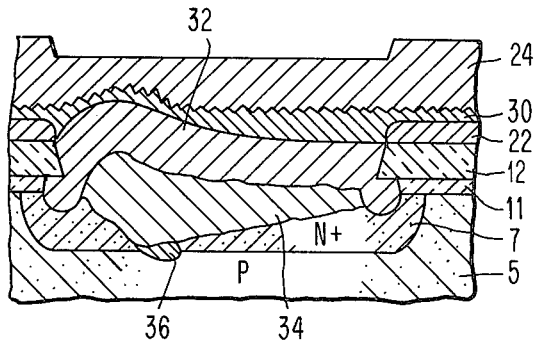

Turning now to FIGS. 2A-2C, the failure mechanism previously alluded to is illustrated with regard to emitter area of the transistor. The processing stage illustrated is after the excess platinum has been removed by aqua regia etchant; the protection for the PtSi is a thin layer, around 30 Å, of $SiO_2$ 11. As previously noted, the aqua regia may also attack localized regions of the platinum silicide to expose the silicon. In the present example, the areas 18 beneath the undercut of silicon nitride layer 12 are exposed to the etchant, and a portion of platinum silicide 9 itself has a pinhole at region 19.

The precise chemical composition of layer 11 is not known, because an analysis of a 30 Å layer is very difficult. It is most likely $SiO_2$, although its composition may be more complex.

In the next step of the fabrication process, the thin $SiO_2$ layer 11 is removed from atop the PtSi lest it act as a high resistivity component of the contact metallurgy. Traditionally, the $SiO_2$ layer 11 is removed using buffered HF solution. One typical mixture is made up from 15 parts $NH_4F$ solution, which contains 60 percent $H_2O$, and 1 part HF solution and 4 parts $H_2O$.

However, as can be seen in FIG. 2B, the HF attacks the exposed N+ silicon. In practice, the standard buffered HF solution removes around 0.7 micron of N+ doped silicon in 50 seconds of etching time. To my knowledge this problem has not been recognized by anyone in the semiconductor processing art. Based on my experiments, the erosion of the N+ regions at areas 18' and 19' is most likely due to an electrochemical reaction between the silicon 7 and platinum silicide layer 9. This is evidenced by the fact that a potential of around 0.25 volts is measured between the PtSi and an N+ silicon region when immersed in buffered HF.

It will be recognized that there are alternatives to improving this situation. For example, improved coverage of the platinum so as to leave no silicon uncovered would alleviate the situation substantially. However, it is very difficult to evaporate the platinum, which is only around 400 Å thick, to assure such complete coverage.

In the next step in the process as described with respect to FIG. 1, layers 22 of chrome and 24 of aluminum-doped copper are deposited. However, because of trenches 18' and 19' in the silicon, the layers deposited are not uniform. In fact, they interact so that there exists very little of the asdeposited metallurgy. This is particularly true after the metallurgy is sintered in standard fashion at around 450° C. Using photomicrography, I have found that various intermetallic compounds are formed. Among them a chrome-silicon layer 30, a chrome-aluminum layer 32, a $PtAl_2$ layer 34, as well as aluminum-copper-silicon layer 36. The existence of layer 36 demonstrates a serious problem, because it indicates that the aluminum-copper 24 has penetrated down through the silicon to the base emitter junction itself. This is an inoperative device.

An analogous problem exists with respect to Schottky barrier region 15 (FIG. 1), although the problem is not illustrated in the drawing. As previously discussed, any direct contact between the Al layer 24 and silicon 2 causes a voltage characteristic which is substantially different from the circuit design. I have found that eliminating all, or substantially all, unbound water from the HF solution and substituting an organic solvent, preferably glycerine, solves this problem. In practice, it is difficult to obtain any HF solution which contains no water whatever. Thus, commercially available HF is 52 percent water by weight, the remaining 48 percent being HF. However, when mixed in glycerine the mixture is free of unbound water, meaning that no water molecules in the unbound state are present because they are bound to the glycerine or other polyhydric alcohols.

The preferred range of the mixture consists of from 1-4 percent HF, which is 52 percent water-48 percent HF, with the remainder being glycerine, although these percentages are not absolute limitations. In fact, as much as 20 percent HF is effective; but control of the etching process, particularly in the manufacturing line, is made more difficult thereby. A mixture containing 2 percent HF appears to be most advantageous.

To the mixture I also add a neutral or anionic wetting agent in the range of 0 to 5 percent by weight, such as Versene, which is commercially available.

It is critical that substantially no $NH_4F$ be in the solution, as it tends to cause pitting of the platinum silicide layer. Buffering is not needed in any event.

Besides glycerine, the organic solvents which are effective include ethylene glycol, propylene glycol and other members of the polyhydric alcohols.

When using my novel etchant, the expanded trenches 18' and 19' illustrated in FIG. 2 do not occur. Moreover, variations in the characteristics of Schottky barrier diodes caused by contact of Al with Si are eliminated.

The duration of the etching is around 5 seconds or so, although durations greater than this do not further result in trenching.

Although my invention has been particularly shown and described with reference to the preferred embodiments thereof, it will be understood by those skilled in the art that the foregoing and other changes in form and details may be made therein without departing from the spirit and scope of the invention.

I claim:

1. In a process for selectively etching a silicon oxide layer which is disposed atop a metallic silicide layer and wherein exposed silicon may be present below or adjacent to said silicide, the step of contacting said oxide layer with an etchant comprising:
   hydrogen fluoride in polyhydric alcohol, the solution being substantially free of unbound water and ammonium fluoride;
   said etchant not substantially attacking either said silicide layer or said silicon.

2. A process as defined in claim 1 wherein said alcohol is glycerine.

3. A process as in claim 1 wherein said etchant contains from 1-4 percent hydrogen fluoride solution which includes water.

4. A process as in claim 2 wherein said etchant contains around 2 percent hydrogen fluoride solution which includes water.

5. A process as in claims 1, 2, 3 or 4 wherein said etchant includes a wetting agent.

6. A process as in claims 1, 2, 3 or 4 wherein said exposed silicon has an N+ or N type impurity concentration.

7. A process as in claims 1, 2, 3 or 4 wherein said metallic silicide is platinum silicide.

* * * * *